United States Patent [19]
Pruijmboom et al.

[11] Patent Number: 5,970,332
[45] Date of Patent: Oct. 19, 1999

[54] METHOD OF MANUFACTURING A SEMICONDUCTOR DEVICE WITH A BICMOS CIRCUIT

[75] Inventors: Armand Pruijmboom, Albuquerque, N.Mex.; Alexander C. L. Jansen, Nijmegen, Netherlands; Ronald Koster, Eindhoven, Netherlands; Willem Van Der Wel, Nijmegen, Netherlands

[73] Assignee: U.S. Philips Corporation, New York, N.Y.

[21] Appl. No.: 08/623,384

[22] Filed: Mar. 27, 1996

[30] Foreign Application Priority Data

Mar. 28, 1995 [EP] European Pat. Off. ............ 95200774

[51] Int. Cl.$^6$ ............................................. H01L 21/8238
[52] U.S. Cl. ............................................ 438/202; 438/234
[58] Field of Search ...................... 148/DIG. 9; 438/202, 438/203, 204, 205, 234

[56] References Cited

U.S. PATENT DOCUMENTS 5,047,357  9/1991  Eklund ..................................... 437/162
5,089,429  2/1992  Hsu .
5,278,085  1/1994  Maddox, III et al. .................... 437/46
5,496,744  3/1996  Ishimaru ................................. 437/162

Primary Examiner—Tuan H. Nguyen
Attorney, Agent, or Firm—Steven R. Biren

[57] ABSTRACT

A method of manufacturing a semiconductor device with a bipolar transistor (1) and a MOS transistor (2) formed in a silicon body (3) which for this purpose is provided with a field insulation region (4) by which semiconductor regions (6, 7) adjoining a surface (5) of said body are mutually insulated. A first region (6) is destined for the bipolar transistor and a second region (7) for the MOS transistor. The second region is provided with a gate dielectric (10). Then an electrode layer of non-crystalline silicon (11) is provided on the surface, which electrode layer is provided with a doping and in which electrode layer subsequently an emitter electrode (12) is formed on the first region and a gate electrode (13) on the second region. The electrode layer is provided with a doping by means of a treatment whereby a first dopant is provided at the area of the first region and a second dopant at the area of the second region, the first dopant being provided to a concentration such that the emitter zone of the transistor can be formed through diffusion from the emitter electrode to be formed in the electrode layer, while the second dopant is provided to a concentration lower than that of the first dopant. Owing to the comparatively low doping level, gate oxide breakdown is prevented during plasma etching and ion implantation.

3 Claims, 4 Drawing Sheets

METHOD OF MANUFACTURING A SEMICONDUCTOR DEVICE WITH A BICMOS CIRCUIT

BACKGROUND OF THE INVENTION

The invention relates to a method of manufacturing a semiconductor device with a bipolar transistor and a MOS transistor which are formed in a silicon body which is for this purpose provided with a field insulation region by which semiconductor regions adjoining a surface of the silicon body are mutually insulated, comprising a first region for the bipolar transistor and a second region for the MOS transistor, after which the second region is provided with a gate dielectric and after which an electrode layer of non-crystalline silicon is deposited on the surface, which electrode layer is provided with a doping and in which electrode layer subsequently an emitter electrode is formed on the first region and a gate electrode on the second region.

A semiconductor device with a single bipolar transistor and a single MOS transistor can be manufactured by such a method. In practice, however, the method will be used for the manufacture of a semiconductor device comprising an integrated circuit of a large number of bipolar and MOS transistors. The circuit may then comprise both NPN and PNP bipolar transistors as well as MOS transistors of the N-channel and P-channel type. Such an integrated circuit, which comprises besides bipolar transistors also NMOS and PMOS transistors, is called an integrated BiCMOS circuit.

After the emitter electrode has been formed on the semiconductor region, the emitter zone of the bipolar transistor can be formed from the doped emitter electrode which lies immediately on the surface of the silicon body through diffusion into the base zone. The gate electrode formed on the second region may be utilized, as is usual, as a mask for the implantation of ions for forming source and drain zones of the MOS transistor in the second region.

U.S. Pat. No. 5,089,429 discloses a method of the kind mentioned in the opening paragraph whereby the electrode layer of non-crystalline silicon is provided with a dopant with a concentration of approximately $10^{20}$ dopant atoms per cc immediately after deposition, which concentration is so high that the emitter zone of the transistor can be formed through diffusion from the emitter electrode to be formed in the electrode layer. Then the electrode layer, which is now well conducting, is provided with an insulating top layer and is etched into a pattern with an emitter electrode on the first semiconductor region and a gate electrode on the second semiconductor region.

The electrode layer of non-crystalline silicon is etched into a pattern in an etching plasma with reactive ions (RIE). During the subsequent formation of the source and drain zones of the MOS transistor, ions of a dopant are implanted, the gate electrode being used as a mask. The electrode layer of non-crystalline silicon could become charged locally during these processes. As a result, strong electric fields could locally arise across the very thin gate dielectric layer present below the layer of non-crystalline silicon. The former could be damaged then by electric breakdown: "gate oxide breakdown". The layer of non-crystalline silicon, however, has already been provided with dopant atoms before the etching process and the implantation process are carried out. The layer of non-crystalline silicon is conducting during said processes as a result, whereby any local charging is avoided. Damage to the very thin layer of gate dielectric is prevented thereby.

The entire electrode layer is comparatively heavily doped in the known method. When the method is used for manufacturing a semiconductor device with both NMOS and PMOS transistors, the gate electrodes of both types of MOS transistors will have the same conductivity type. These transistors will accordingly have threshold voltages of different absolute values.

After doping, the layer of non-crystalline silicon is provided with a silicon oxide top layer. The pattern is then etched into this top layer as well as into the layer of non-crystalline silicon during the etching treatment. The top layer remaining on the gate electrodes protects these electrodes during the implantation of dopant atoms for the formation of the source and drain zones. The top layer must be locally removed for external contacting of the gate electrodes. If the gate electrodes are to be provided with a conducting silicide layer in a self-aligned manner, through deposition of a metal layer and a subsequent heat treatment, this top layer should even be entirely removed.

SUMMARY OF THE INVENTION

The invention has for its object inter alia to provide a method which does not have the above disadvantages. According to the invention, the method mentioned in the opening paragraph is for this purpose characterized in that the electrode layer is provided with the doping by means of a treatment whereby a first doping is provided at the area of the first region and a second doping at the area of the second region, the first doping being provided to a concentration such that the emitter zone of the transistor can be formed through diffusion from the emitter electrode to be formed in the electrode layer, while the second doping is provided to a concentration which is lower than that of the first doping.

The electrode layer must be heavily doped in order to form the emitter zone of the transistor through diffusion from the emitter electrode. In practice, a doping is used for this with more than $10^{20}$ dopant atoms per cc in the layer. It is found, however, that the local charging of the layer of non-crystalline silicon as mentioned above is avoided during etching in a plasma or during ion implantation with a doping of comparatively low concentration, for example less than $10^{18}$ dopant atoms per cc. Such a weak doping does not influence the doping of the gate electrodes in practice. When the method is used for making NMOS and PMOS transistors, the gate electrodes are used as a mask during the implantation of the source and drain zones of the MOS transistors and receive the same comparatively strong doping as the source and drain zones. This doping is comparatively strong, in practice more than $10^{20}$ atoms per cc, so that the gate electrodes become highly conductive. In addition, the gate electrode of the NMOS transistor becomes N-type and that of the PMOS transistor P-type. The threshold voltages of these two transistors then have practically the same absolute values, for example, approximately −0.8 and +0.8 V in practice, respectively.

The electrode layer is doped before the emitter electrode is formed therein. Accordingly, the emitter electrode has been doped already right from the moment it was etched from the electrode layer of non-crystalline silicon. After the formation of the emitter electrode, a mask would be necessary for this doping covering the first semiconductor region next to the emitter electrode.

The emitter electrode and the gate electrodes are formed in an uncovered electrode layer of non-crystalline silicon. These electrodes can accordingly be directly provided with a highly conductive top layer made of a metal silicide through self-alignment. A layer of the metal deposited on the electrodes reacts with the non-crystalline silicon during a heat treatment, resulting in the formation of the metal silicide.

A photoresist mask is necessary for providing the doping to such a concentration that the emitter zone of the transistor can be formed through diffusion from the emitter electrode to be formed in the electrode layer. A photoresist mask may also be used for providing the doping of comparatively low concentration in the electrode layer at the area of the second region. Such an additional masking step is an expensive process step and is preferably avoided. In the preferred embodiments of the method to be described below, only one mask is used for providing the two dopings mentioned.

In a first preferred embodiment of the method, in the treatment of the electrode layer, said layer is provided with the first doping at the area of the first region, whereupon a thermal oxidation treatment is carried out, after which the formed silicon oxide is subjected to an etching treatment until the electrode layer has become exposed again at the area of the second region, and subsequently the electrode layer is provided with the second doping at the area of the second region.

A mask is used for providing the first doping. During the subsequent thermal oxidation treatment, silicon oxide grows on doped non-crystalline silicon more quickly than on non-doped non-crystalline silicon. A thicker layer of silicon oxide is accordingly formed on the doped non-crystalline silicon than on the non-doped silicon. After the layer of non-crystalline silicon has become exposed again next to the first semiconductor region, a layer of silicon oxide is still present on the layer at the area of the first semiconductor region. This layer of silicon oxide prevents during the second doping that atoms of the dopant also enter the layer of non-crystalline silicon at the area of the first semiconductor region. These atoms could have a very detrimental effect on the formation of the bipolar transistor.

In a second embodiment of the method, during the treatment of the electrode layer, said layer is provided with a layer of silicon nitride at the area of the first semiconductor region, whereupon the electrode layer is provided with the second doping at the area of the second region, after which a thermal oxidation treatment is carried out, and subsequently the layer of silicon nitride is removed and the electrode layer is provided with the first doping at the area of the first region.

A mask is used for providing the layer of silicon nitride. The silicon nitride layer is used as a mask for providing the second doping. A layer of silicon oxide is formed next to the layer of silicon nitride, i.e. on the layer of non-crystalline silicon next to the first semiconductor region, during the thermal oxidation treatment. The layer of silicon nitride is then removed. When the first doping is being provided, the silicon oxide layer formed shields the layer of non-crystalline silicon next to the first semiconductor region.

BRIEF DESCRIPTION OF THE DRAWING

The invention will be explained in more detail below by way of example with reference to a drawing, in which.

DESCRIPTION OF THE PREFERRED EMBODIMENTS

Figure 1:
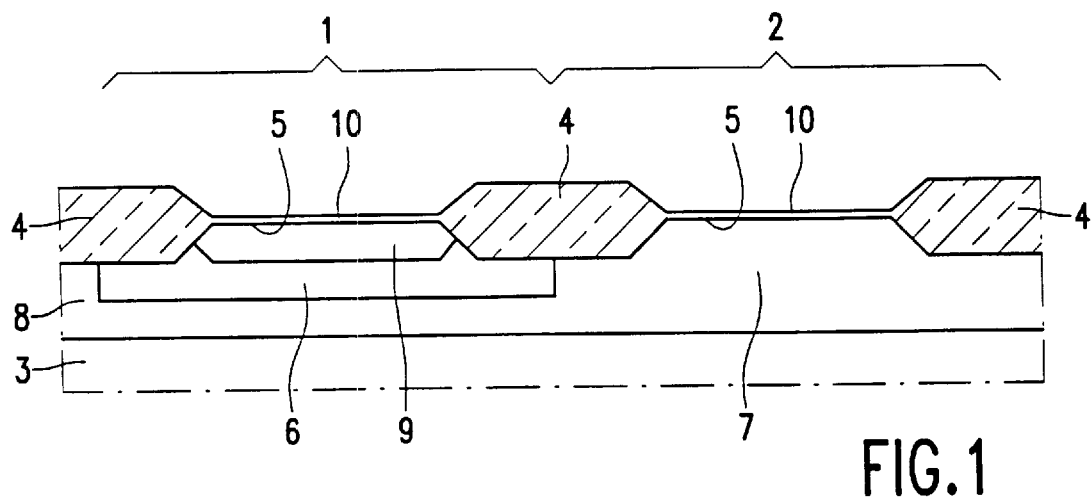
FIGS. 1 to 4 diagrammatically and in cross-section show several stages in the manufacture of a semiconductor device made by the method according to the invention.

FIGS. 1 to 4 diagrammatically and in cross-section show several stages in the manufacture of a semiconductor device comprising a bipolar transistor 1 and a MOS transistor 2. The bipolar transistor 1 in this example is an NPN transistor, the MOS transistor 2 an NMOS transistor. Said transistors 1 and 2 are formed in a silicon body 3 which is for this purpose provided with a field insulation region 4 by which semiconductor regions 6 and 7 adjoining a surface 5 of the silicon body 3 are mutually insulated. Of these regions 6 and 7, a first region 6 is destined for the NPN transistor 1 and the second region 7 for the NMOS transistor 2. The second region 7 forms part of a surface layer 8 of the semiconductor body 3 and in this example is a p-type conducting epitaxially grown layer with a doping concentration of approximately $10^{15}$ atoms per cc. The semiconductor regions 6 are formed in the surface layer 8 in a usual manner, with an n-type doping to a concentration of approximately $10^{16}$ atoms per cc. In addition, a base zone 9 with a p-type doping to a concentration of approximately $10^{18}$ atoms per cc is formed in the first semiconductor region 6 which is destined for the bipolar transistor 1. The surface 5 of the semiconductor zones is provided with an approximately 15 mm thick gate dielectric layer 10 by thermal oxidation.

In the next process step, the gate dielectric 10 is removed from the first semiconductor region 6, whereas it is maintained on the second region 7 which is designed for the NMOS transistor 2. Then an approximately 500 nm thick electrode layer of non-crystalline, in this example polycrystalline, silicon 11 is provided on the surface 5.

As will be described further below, the electrode layer 1 is provided with a doping, in this example n-type, and is subsequently etched into a pattern with an emitter electrode 12 on the first semiconductor region 6 and a gate electrode 13 on the second semiconductor region 7.

After the emitter electrode 12 has been formed on the first semiconductor region 6, the n-type emitter zone 14 with a doping level of approximately $10^{20}$ atoms per cc of the bipolar transistor 1 is formed from the doped emitter electrode 12 situated immediately on the surface 6 through diffusion into the p-type base zone 9. Then the emitter electrode 12 and gate electrode 13 are provided with lateral insulation edges or spacers 16 of silicon oxide in a usual manner. The gate electrode 13 provided with the spacers 16 is subsequently utilized as a mask in the implantation of ions whereby source and drain zones 15 of the NMOS transistor 2 are formed with a doping level of approximately $10^{20}$ atoms per cc. Finally, the electrodes 12 and 13, the base zone 19, and the source and drain zones 15 are provided with a top layer 17 of a metal silicide such as, for example, titanium or cobalt disilicide.

The electrode layer 11 is provided with the dopant by means of a treatment whereby a first dopant is provided at the area of the first region 6 and a second dopant at the area of the second region 7, the first dopant being provided to a concentration such that the emitter zone 14 of the transistor 1 can be formed through diffusion from the emitter electrode 12 to be formed in the electrode layer 11, while the second dopant is provided to a concentration lower than that of the first dopant. To avoid misunderstandings, the first and the second dopant are referred to as heavy and light dopant/doping, respectively, hereinafter.

The electrode layer 11 is heavily doped at the area of the first semiconductor region 6 with more than $10^{20}$ atoms per cc, and lightly doped at the area of the second semiconductor region with less than $10^{18}$ atoms per cc. This light doping prevents local charging of the layer of non-monocrystalline silicon 11 during plasma etching or ion implantation, and thus prevents gate oxide breakdown.

Such a light doping, on the other hand, does not influence other dopants to be provided in the layer. When the method is used, for example, for manufacturing in addition a PMOS transistor (not shown) next to the NMOS transistor 2, the gate electrodes are used for masking during the implantation of the source and drain zones of these MOS transistors, and these gate electrodes than receive the same doping as the source and drain zones. This doping is higher than $10^{20}$ atoms per cc in practice, so that the gate electrodes will become highly conductive. In addition, the gate electrode of the NMOS transistor 2 becomes n-type and that of the PMOS transistor p-type. The threshold voltages of these two transistors will then have substantially the same absolute value, in practice, for example, −0.8 and +0.8 V, respectively.

Only one mask is used for providing the two dopings in the electrode layer 11 in the embodiments of the method to be described below.

Figure 2:
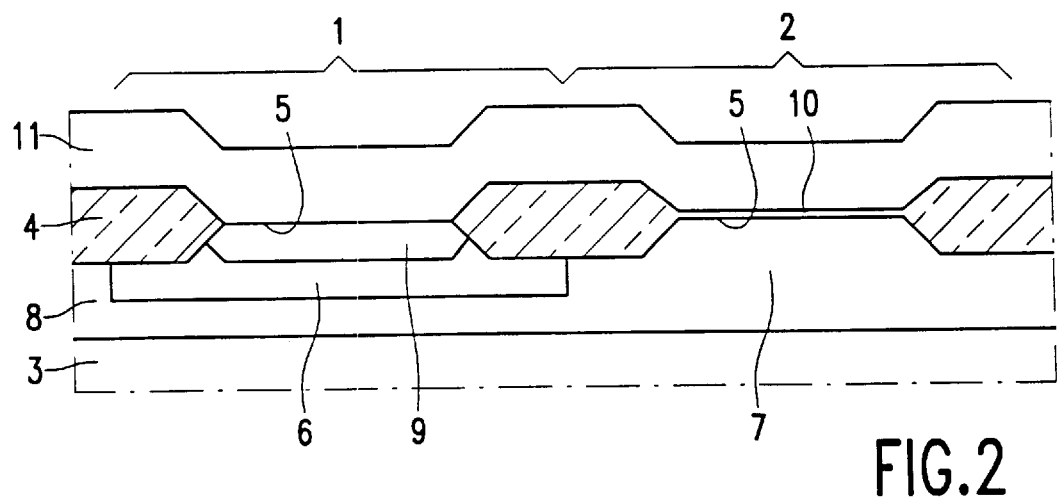
Figure 3:
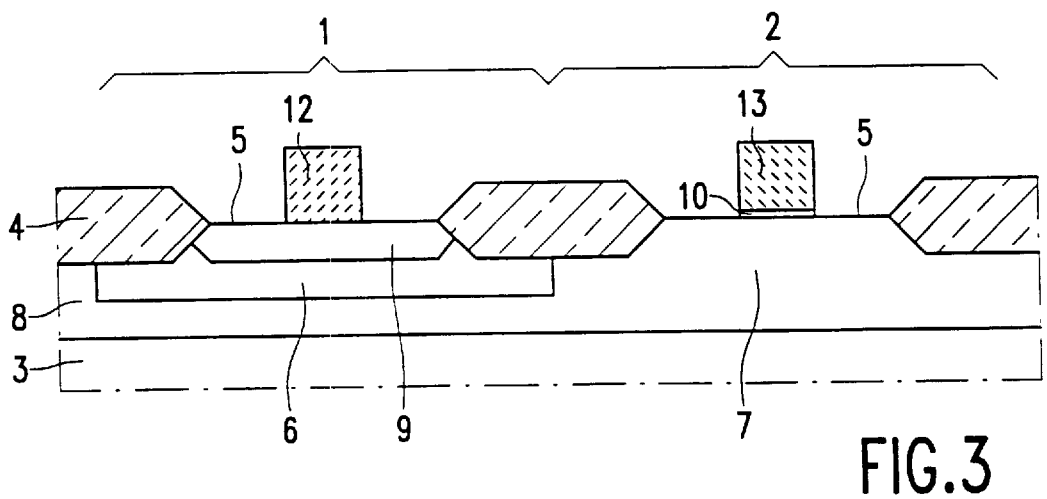
Figure 4:
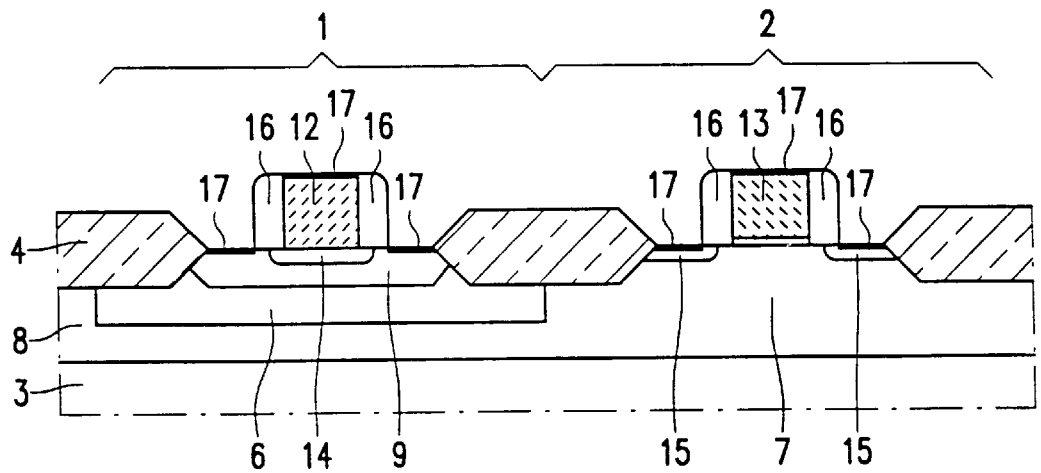
Figure 5:
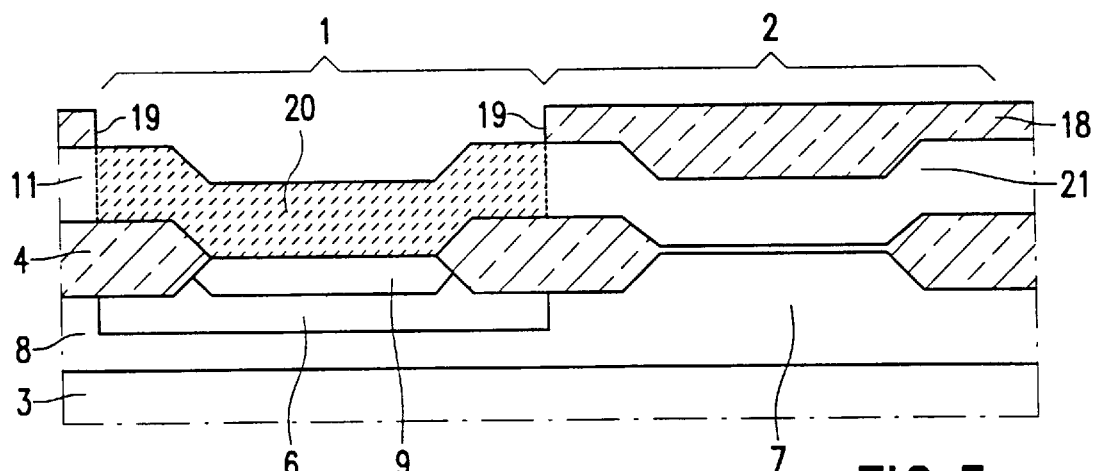
FIGS. 5 to 8 diagrammatically and in cross-section show several stages in the manufacture of a semiconductor device made by a first embodiment of the method according to the invention.
Figure 6:
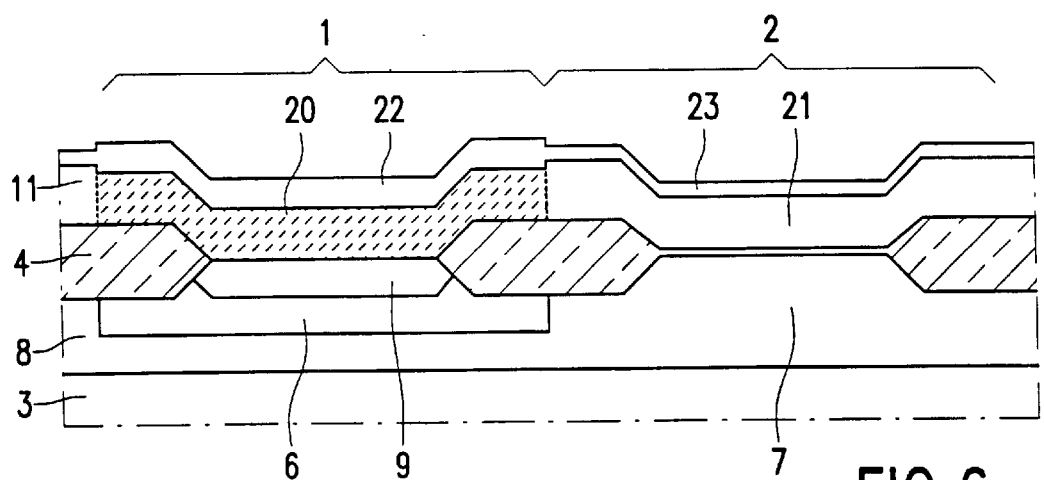
Figure 7:
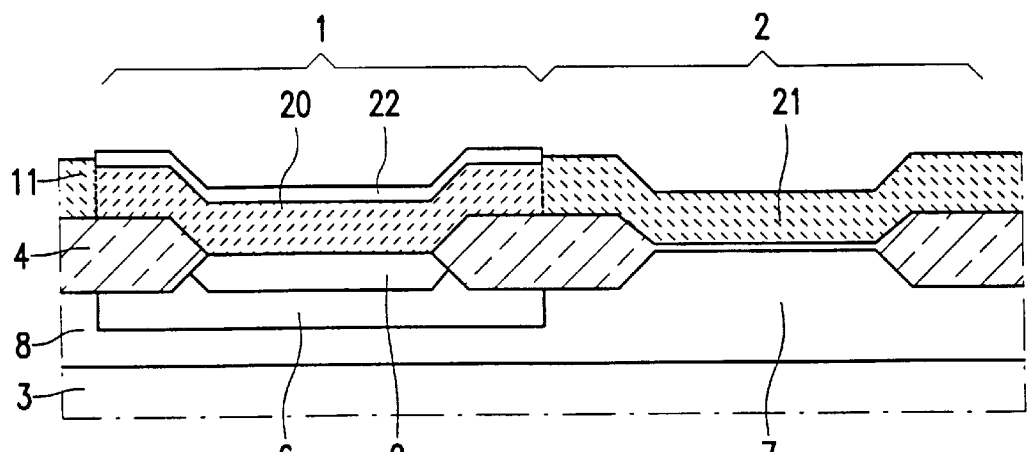

In a first embodiment of the method, the electrode layer 11 is first provided with the heavy doping at the area of the first region in the treatment of this electrode layer. The starting point here is the stage of manufacture as shown in FIG. 2. Then, as shown in FIG. 5, a photoresist mask 18 is provided on the layer of non-crystalline silicon 11 with a window 19 which exposes a portion 20 of the electrode layer 11 at the area of the first semiconductor region 6. The heavy doping with arsenic ions is carried out in this portion 20 during the subsequent process step in a usual manner. No ions are implanted into the remaining portion 21 of the layer of non-crystalline silicon 11 situated next to the portion 20 during this ion implantation, said remaining portion being shielded by the photoresist mask 18.

After the implantation, the electrode layer 11 is subjected to a usual thermal oxidation treatment. During this oxidation treatment, oxide grows more quickly on the arsenic-doped portion 20 than on the non-doped portion 21 of the electrode layer of non-crystalline silicon 11. On the heavily arsenic-doped portion 20 of the layer of non-crystalline silicon 11, accordingly, a layer of silicon oxide 22 is formed which is thicker than the layer of silicon oxide 23 formed on the non-doped portion 21. In the present example, an approximately 250 nm thick layer of silicon oxide 22 is formed on the heavily doped portion 20 and an approximately 50 nm thick layer 23 on the lightly doped portion 21 in approximately two hours at a temperature of 700° C.

After that, a usual oxide etching treatment is carried out until the portion 21 of the electrode layer 11 has become exposed again next to the portion 22 thereof implanted with arsenic ions. Then the light doping step is carried out, phosphorus ions being implanted into said exposed portion 21 here. No ions are implanted into the portion 20 of the electrode layer 11 situated next to the portion 21 during this ion implantation, portion 20 being shielded here by the layer of silicon oxide 22 which is now approximately 200 nm thick. Even a low concentration of phosphorus in the emitter electrode would have a very detrimental effect on the formation of the bipolar transistor.

Figure 8:
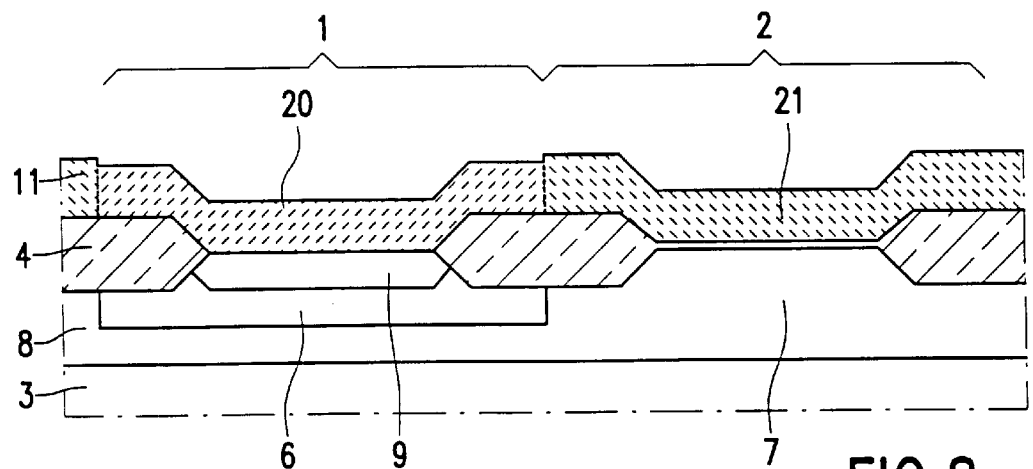

After removal of the silicon oxide layer 22, the stage of manufacture as shown in FIG. 8 is reached, with an electrode layer 11 comprising a heavily doped portion 20 and a lightly doped portion 21. The subsequent manufacture of the semiconductor device then proceeds as described with reference to FIGS. 3 and 4.

A mask 18 was used for providing the heavy doping, whereas the subsequent process steps were carried out without mask.

Figure 9:
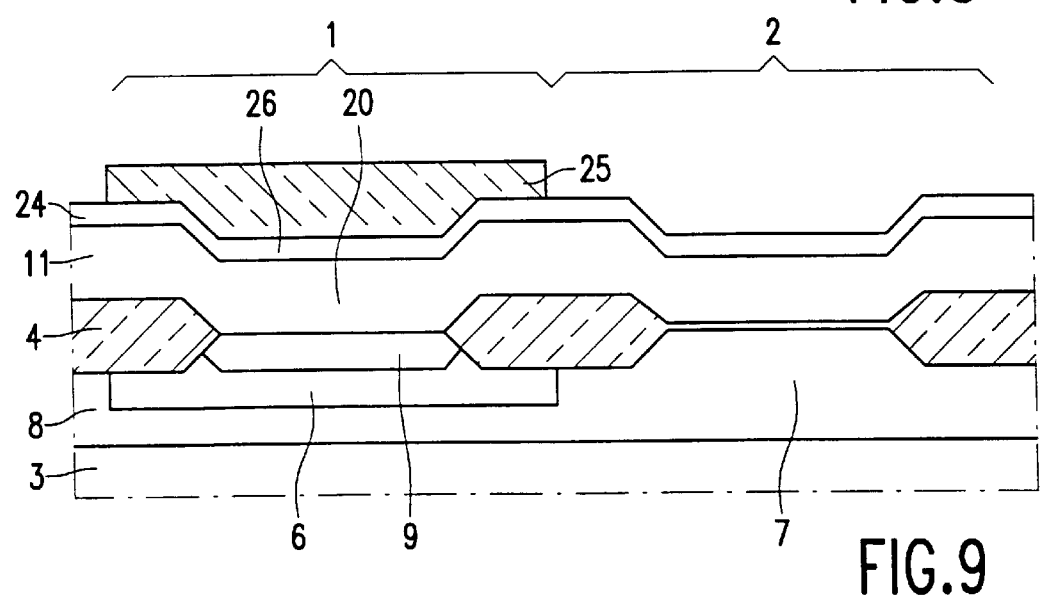
FIGS. 9 to 12 diagrammatically and in cross-section show several stages in the manufacture of a semiconductor device made by a second embodiment of the method according to the invention.
Figure 10:
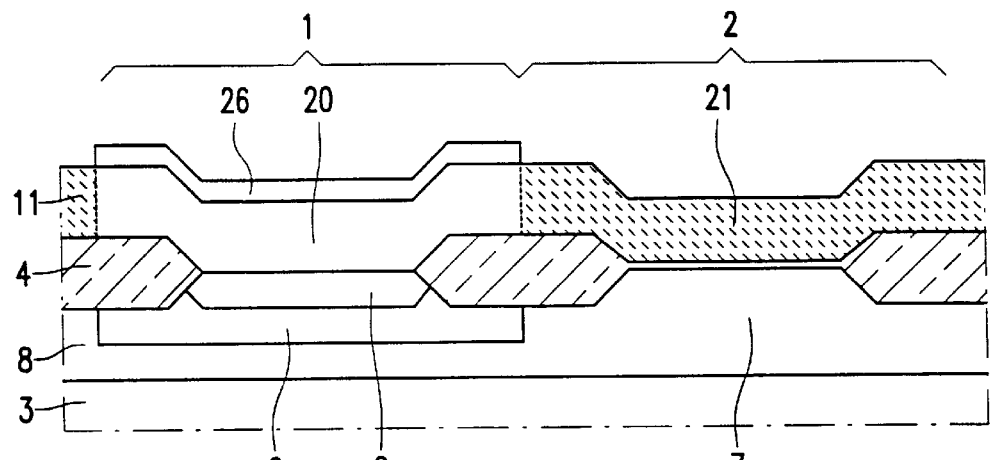
Figure 11:
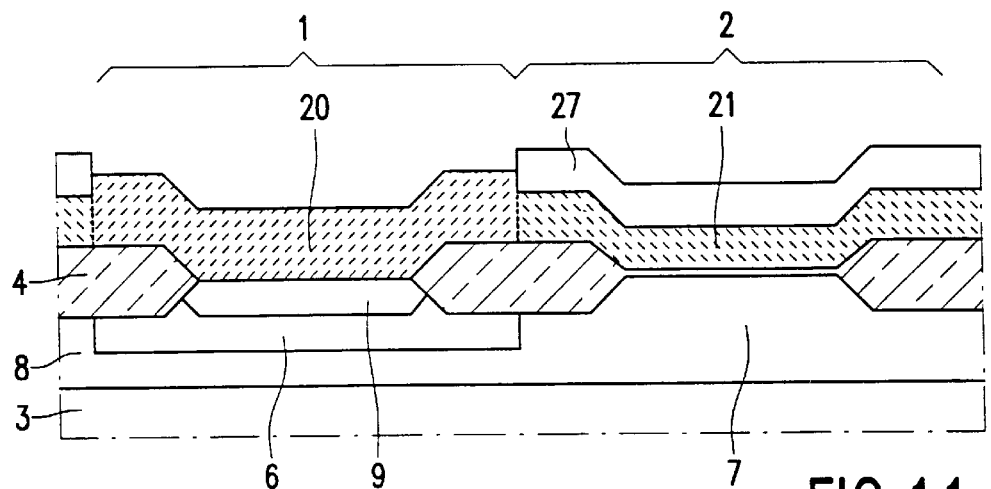

In a second embodiment of the method, the electrode layer 11 under treatment is first provided with an approximately 10 nm thick layer of silicon nitride 26 at the area of the first region 6. The starting point again is the stage of manufacture shown in FIG. 2 and, as shown in FIG. 9, a layer of silicon nitride 24 is first deposited on the electrode layer 11, whereupon subsequently a photoresist mask 25 is provided in a usual manner. This photoresist mask 25 covers a portion 26 of the layer of silicon nitride 24 as well as the portion 20 of the electrode layer 11 at the area of the first semiconductor region 6.

The silicon nitride layer 24 is subsequently etched away from the portion 21 of the electrode layer 11 situated next to the portion 20, after which the portion 21 is given the light doping, phosphorus ions being implanted into said layer. The portion 20 of the electrode layer 11 is protected here by the portion 26 of the silicon nitride layer 24, so that no phosphorus will enter the portion 20 of the electrode layer 11.

After the phosphorus doping has been provided in the portion 21 of the electrode layer 11, the semiconductor body 3 is subjected to a thermal oxidation treatment whereby an approximately 100 nm thick layer of silicon oxide 27 is formed on the portion 21. After removal of the portion 26 of the silicon nitride layer 24, the portion 20 of the electrode layer 11 is provided with the heavy doping at the area of the first semiconductor region 6, arsenic ions being implanted into the layer. During the implantation of arsenic ions, the silicon oxide layer 27 formed previously shields the portion 21 of the electrode layer 11 next to the first semiconductor region 6.

Figure 12:
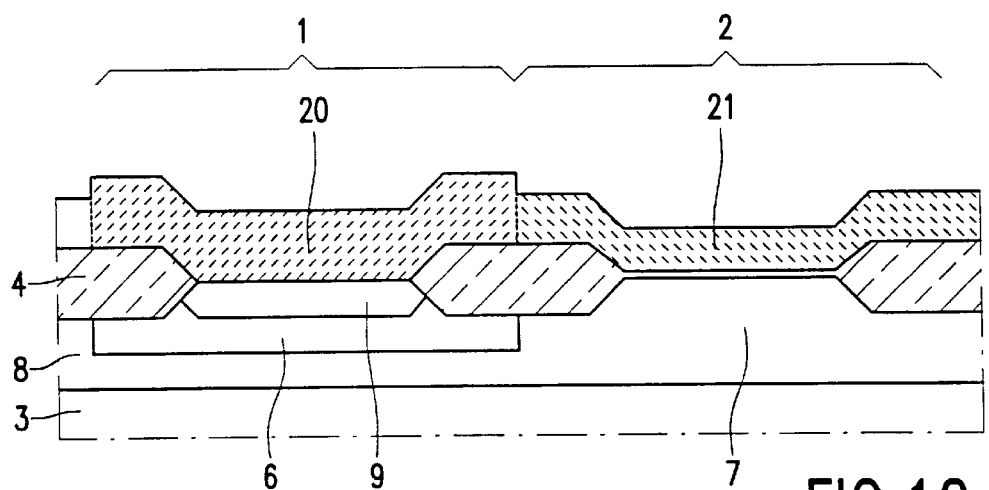

After removal of the silicon oxide layer 27, the stage of manufacture as shown in FIG. 12 is reached, with an electrode layer 11 comprising a heavily doped portion 20 and a lightly doped portion 21. The subsequent manufacture of the semiconductor device then proceeds as described with reference to FIGS. 3 and 4.

A mask 25 was used for providing the silicon nitride layer 26 at the area of the first semiconductor region 6, whereas the subsequent process steps were carried out without mask.

It is noted that the manufacture of a semiconductor device with an NPN bipolar and an NMOS transistor is described in the examples. The invention is not limited to the manufacture of such a device. By replacing all N-type dopings with P-type dopings and simultaneously all P-type dopings with N-type dopings, it is possible to form a PNP bipolar and a PMOS transistor. The light doping of the electrode layer 11 may then remain of the same conductivity type; it may also be effected with phosphorus. This phosphorus doping in addition prevents boron from entering the gate dielectric during the manufacture of the PMOS transistor. The manufacture of a semiconductor device with a single bipolar transistor and a single MOS transistor was described above. In practice, however, the method will be used for the manufacture of a semiconductor device comprising an integrated circuit with a large number of bipolar and MOS transistors. The circuit then may comprise NPN as well as PNP bipolar transistors, and MOS transistors of the N-channel as well as of the P-channel type.

We claim:

1. A method of manufacturing a semiconductor device with a bipolar transistor and a MOS transistor which are formed in a silicon body, comprising providing said body with a field insulation region by which semiconductor regions adjoining a surface of the silicon body are mutually insulated, comprising a first region for the bipolar transistor and a second region for the MOS transistor, then providing the second region with a gate dielectric and depositing an electrode layer of non-crystalline silicon on the surface, providing said electrode layer with a doping and then forming an emitter electrode in said electrode layer on the first region and forming a gate electrode on the second region, providing the electrode layer with the doping by means of a treatment comprising providing a first doping at an area of the first region and providing a second doping at an area of the second region, the first doping being provided to a concentration such that an emitter zone of the transistor is formed through diffusion from the emitter electrode formed in the electrode layer, and the second doping is provided to a concentration which is lower than that of the first doping such that local charging of the electrode layer of non-crystalline silicon and gate dielectric breakdown are prevented.

2. A method as claimed in claim 1, comprising, in the treatment of the electrode layer, providing said electrode layer with the first doping at the area of the first region, then performing a thermal oxidation treatment, then subjecting a silicon oxide formed thereby to an etching treatment until the electrode layer has become exposed again at the area of the second region, and then providing the electrode layer with the second doping at the area of the second region.

3. A method as claimed in claim 1, comprising, during the treatment of the electrode layer, providing said electrode layer with a layer of silicon nitride at the area of the first region, then providing the electrode layer with the second doping at the area of the second region, then performing a thermal oxidation treatment, and then removing the layer of silicon nitride and providing the electrode layer with the first doing at the area of the first region.

\* \* \* \* \*